United States Patent
Platt

(10) Patent No.: US 6,792,802 B2
(45) Date of Patent: Sep. 21, 2004

(54) NOISE SOURCE FOR STARTING MEMS GYROSCOPE

(75) Inventor: William P. Platt, Columbia Heights, MN (US)

(73) Assignee: Honeywell International Inc., Morristown, NJ (US)

( * ) Notice: Subject to any disclaimer, the term of this patent is extended or adjusted under 35 U.S.C. 154(b) by 55 days.

(21) Appl. No.: 10/092,819

(22) Filed: Mar. 7, 2002

(65) Prior Publication Data

US 2003/0167842 A1 Sep. 11, 2003

(51) Int. Cl.[7] ................................................ G01P 9/02
(52) U.S. Cl. .............................. 73/504.12; 73/504.32
(58) Field of Search ..................... 73/504.04, 504.12, 73/504.32, 504.16

(56) References Cited

U.S. PATENT DOCUMENTS

| | | | |
|---|---|---|---|
| 4,704,587 A | 11/1987 | Ouyang et al. | 331/116 |
| 5,416,584 A | 5/1995 | Kay | 356/350 |
| 5,747,961 A | 5/1998 | Ward et al. | 318/646 |
| 5,892,153 A | 4/1999 | Weinberg et al. | 73/504.16 |
| 5,911,156 A * | 6/1999 | Ward et al. | 73/504.16 |
| 6,057,742 A | 5/2000 | Prado | 331/158 |
| 6,064,169 A | 5/2000 | Ward et al. | 318/646 |
| 6,497,147 B2 * | 12/2002 | Kato et al. | 73/504.12 |
| 6,510,737 B1 * | 1/2003 | Hobbs | 73/504.12 |

FOREIGN PATENT DOCUMENTS

EP    1 031 815 A1    8/2000    ........... G01C/19/56

OTHER PUBLICATIONS

White, Rober D. "Effects of Impact and Vibration on the Performance of a Micromachined Tuning Fork Gyroscope", Massachusetts Institute of Technology, 1999.*
International Search Report for PCT/US03/06939 mailed on Jul. 4, 2003.

* cited by examiner

*Primary Examiner*—Hezron Williams
*Assistant Examiner*—John Hanley
(74) *Attorney, Agent, or Firm*—McDonnell Boehnen Hulbert & Berghoff LLP

(57) ABSTRACT

By injecting noise into drive electronics, the start time of the MEMS gyroscope may be improved. A noise source is used to provide bandwidth limited white noise with a bandwidth centered substantially at the tuning fork frequency of at least one proof mass.

20 Claims, 3 Drawing Sheets

NOISE SOURCE FOR STARTING MEMS GYROSCOPE

FIELD

The present invention relates generally to MEMS gyroscopes, and more particularly, relates to a noise source for starting a MEMS gyroscope.

BACKGROUND

Microelectromechanical systems (MEMS) integrate electrical and mechanical devices on the same silicon substrate using microfabrication technologies. The electrical components are fabricated using integrated circuit processes, while the mechanical components are fabricated using micromachining processes that are compatible with the integrated circuit processes. This combination makes it possible to fabricate an entire system on a chip using standard manufacturing processes.

One common application of MEMS is the design and manufacture of sensor devices. The mechanical portion of the device provides the sensing capability, while the electrical portion processes the information obtained by the mechanical portion. One example of a MEMS sensor is a MEMS gyroscope.

A type of MEMS gyroscope uses a vibrating element to sense angular rate through the detection of a Coriolis acceleration. The vibrating element is put into oscillatory motion in the X-axis (drive plane), which is parallel to the substrate. Once the vibrating element is put in motion, it is capable of detecting angular rates induced by the substrate being rotated about the Z-axis (input plane), which is perpendicular to the substrate. The Coriolis acceleration occurs in the Y-axis (sense plane), which is perpendicular to both the X-axis and the Z-axis. The Coriolis acceleration produces a Coriolis motion that has an amplitude that is proportional to the angular rate of the substrate.

The start time of a device is the time required to produce a usable output after power application. The start time is dependant upon the cumulative times of multiple steps required to start the device. The time it takes for the drive electronics to detect and amplify the oscillatory motion of the vibrating element impacts the start time of the MEMS gyroscope.

A typical MEMS gyroscope takes between one and two seconds to start. There are MEMS gyroscope applications that require faster start times. For example, some inertial measurement units (IMUs) that include one or more MEMS gyroscopes may require a start time of one second or less.

Therefore, it would be desirable to have a MEMS gyroscope that starts in one second or less. The start time of the MEMS gyroscope is improved by reducing the time it takes for the drive electronics to detect and amplify the oscillatory motion of the vibrating element.

SUMMARY

A MEMS gyroscope system and method for improving the start time of a MEMS gyroscope are provided. By using a noise source to inject noise into drive electronics, the start time of a MEMS gyroscope may be improved.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
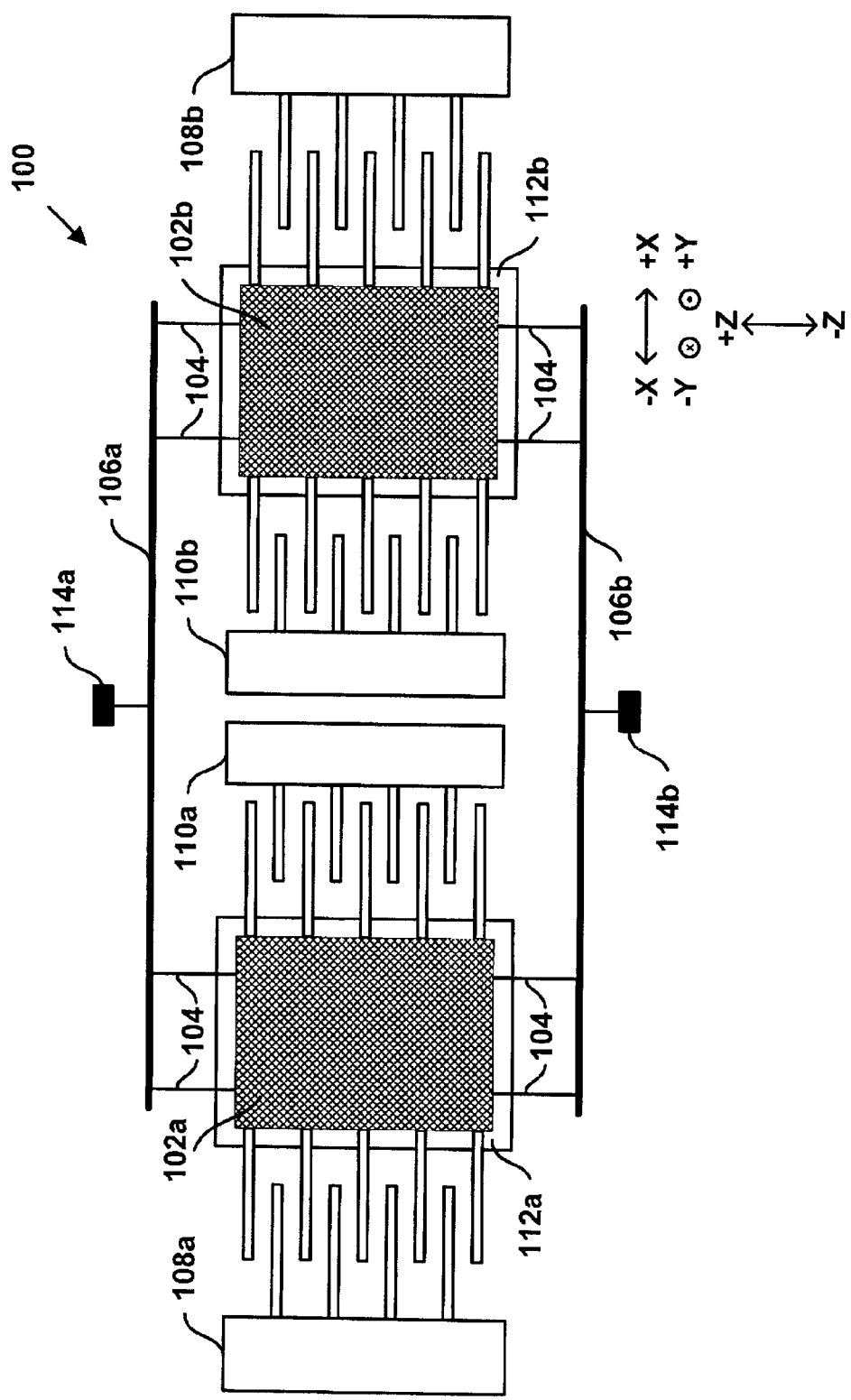
FIG. 1 is a plan view of a MEMS gyroscope, according to an exemplary embodiment.

FIG. 1 shows a plan view of a microelectromechanical system (MEMS) gyroscope 100 according to an exemplary embodiment. While FIG. 1 shows the MEMS gyroscope 100 as a tuning fork gyroscope, other MEMS vibratory gyroscopes that use the Coriolis acceleration to detect rotation, such as an angular rate sensing gyroscope, may also be used. The MEMS gyroscope 100 may be formed on a substrate and may include at least one proof mass 102a, 102b; a plurality of support beams 104; at least one cross beam 106a, 106b; at least one motor drive comb 108a, 108b; at least one motor pickoff comb 110a, 110b; at least one sense plate 112a, 112b; and at least one anchor 114a, 114b.

The at least one proof mass 102a, 102b may be any mass suitable for use in a MEMS gyroscope system. In a preferred embodiment, the at least one proof mass 102a, 102b is a plate of silicon. Other materials that are compatible with micromachining techniques may also be employed. FIG. 1 shows two proof masses; however, one or more proof masses may be employed.

The at least one proof mass 102a, 102b may be located substantially between the at least one motor drive comb 108a, 108b and the at least one motor pickoff comb 110a, 110b. The at least one proof mass 102a, 102b may contain a plurality of comb-like electrodes extending towards both the at least one motor drive comb 108a, 108b and the at least one motor pickoff comb 110a, 110b. While the at least one proof mass 102a, 102b has ten electrodes as depicted in FIG. 1, the number of electrodes on the at least one proof mass 102a, 102b may be more or less than ten.

The at least one proof mass 102a, 102b may be supported above the at least one sense plate 112a, 112b by the plurality of support beams 104. While eight support beams 104 are depicted in FIG. 1, the number of support beams used may be more or less than eight. The plurality of support beams 104 may be beams micromachined from a silicon wafer. The plurality of support beams 104 may act as springs allowing the at least one proof mass 102a, 102b to move within the drive plane (X-axis) and the sense plane (Y-axis). (See FIG. 1 for axis information.)

The plurality of support beams 104 may be connected to at least one cross beam 106a, 106b. The at least one cross beam 106a, 106b may be connected to at least one anchor 114a, 114b providing support for the MEMS gyroscope 100. The at least one anchor 114a, 114b may be connected to the underlying substrate. While two anchors 114a, 114b are depicted in FIG. 1, the number of anchors may be more or less than two. The at least one anchor 114a, 114b may be positioned along the at least one cross beam 106a, 106b in any manner that provides support to the MEMS gyroscope 100.

The at least one motor drive comb 108a, 108b may include a plurality of comb-like electrodes extending towards the at least one proof mass 102a, 102b. While the at least one motor drive comb 108a, 108b has four electrodes as depicted in FIG. 1, the number of electrodes on the at least one motor drive comb 108a, 108b may be more or less than four. The number of the electrodes on the at least one motor drive comb 108a, 108b may be determined by the number of electrodes on the at least one proof mass 102a, 102b.

The plurality of interdigitated comb-like electrodes of the at least one proof mass 102a, 102b and the at least one motor drive comb 108a, 108b may form capacitors. The at least one motor drive comb 108a, 108b may be connected to drive electronics, not shown in FIG. 1. The drive electronics may cause the at least one proof mass 102a, 102b to oscillate at substantially a tuning fork frequency along the drive plane (X-axis) by using the capacitors formed by the plurality of interdigitated comb-like electrodes of the at least one proof mass 102a, 102b and the at least one motor drive comb 108a, 108b.

The at least one motor pickoff comb 110a, 110b may include a plurality of comb-like electrodes extending towards the at least one proof mass 102a, 102b. While the at least one motor pickoff comb 110a, 110b has four electrodes as depicted in FIG. 1, the number of electrodes on the at least one motor pickoff comb 110a, 110b may be more or less than four. The number of the electrodes on the at least one motor pickoff comb 110a, 110b may be determined by the number of electrodes on the at least one proof mass 102a, 102b.

The plurality of interdigitated comb-like electrodes of the at least one proof mass 102a, 102b and the at least one motor pickoff comb 110a, 110b may form capacitors, which may allow the MEMS gyroscope 100 to sense motion in the drive plane (X-axis).

The at least one sense plate 112a, 112b may form a parallel capacitor with the at least one proof mass 102a, 102b. If an angular rate is applied to the MEMS gyroscope 100 along the input plane (Z-axis) while the at least one proof mass 102a, 102b is oscillating along the drive plane (X-axis), a Coriolis force may be detected in the sense plane (Y-axis). The parallel capacitor may be used to sense motion in the sense plane (Y-axis). The output of the MEMS gyroscope 100 may be a signal proportional to the change in capacitance. The at least one sense plate 112a, 112b may be connected to sense electronics, not shown in FIG. 1. The sense electronics may detect the change in capacitance as the at least one proof mass 102a, 102b moves towards and/or away from the at least one sense plate 112a, 112b.

Figure 2:
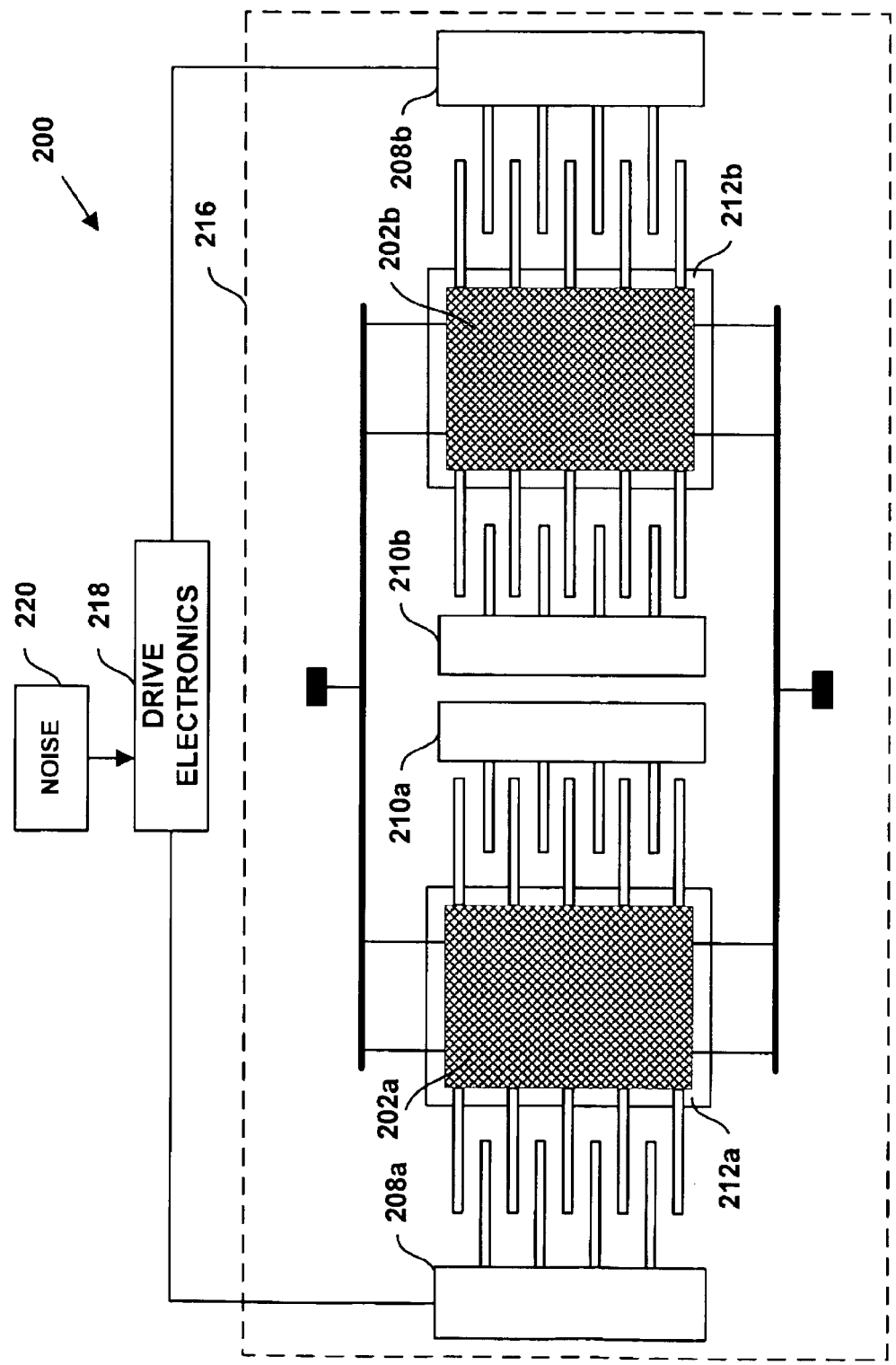
FIG. 2 is a plan view of a MEMS gyroscope system, according to an exemplary embodiment.

FIG. 2 shows a plan view of a MEMS gyroscope system 200. The MEMS gyroscope system 200 may include a MEMS gyroscope 216 and drive electronics 218. The MEMS gyroscope system may also include sense electronics, a system power source, and other typical operational electronics, which are not shown in FIG. 2 for the sake of simplification. The MEMS gyroscope 216 may be substantially the same as MEMS gyroscope 100 as depicted in FIG. 1. The drive electronics 218 may be any combination of electronic devices capable of providing a drive voltage to the at least one motor drive comb 208a, 208b which causes the at least one proof mass 202a, 202b to oscillate.

To start the MEMS gyroscope system 200, the system power source may provide power to the MEMS gyroscope 216. The system power source may be any power source used to power a typical MEMS gyroscope. For example, the system power source may be the power source for an avionics system that includes at least one MEMS gyroscope. The system power source may provide power based upon the system application. The system power source typically provides power in the range of 5 to 1000 volts; however, this embodiment is not limited to that range.

The drive electronics 218 may apply a drive voltage to the at least one motor drive comb 208a, 208b which causes the at least one proof mass 202a, 202b to oscillate. The drive electronics 218 may lock onto substantially the tuning fork frequency of the at least one proof mass 202a, 202b. The time it takes to lock onto the tuning fork frequency may impact the start time of the MEMS gyroscope system 200. Alternatively, for MEMS gyroscope systems 200 with a high resonance quality factor, Q, the drive electronics 218 may not be able to find the tuning fork frequency and the MEMS gyroscope system 200 may not start.

To improve the start time of the MEMS gyroscope system 200, noise 220 may be injected into the drive electronics 218. The noise 220 may be injected into the drive electronics 218 after the system power source has been applied to the MEMS gyroscope 216, but substantially before the MEMS gyroscope 216 has reached full power. By injecting the noise 220 prior to the MEMS gyroscope 216 reaching full power, the start time of the MEMS gyroscope 216 may be reduced. Once the drive electronics 218 locks onto the tuning fork frequency, the injection of the noise 220 may be discontinued.

Figure 3:
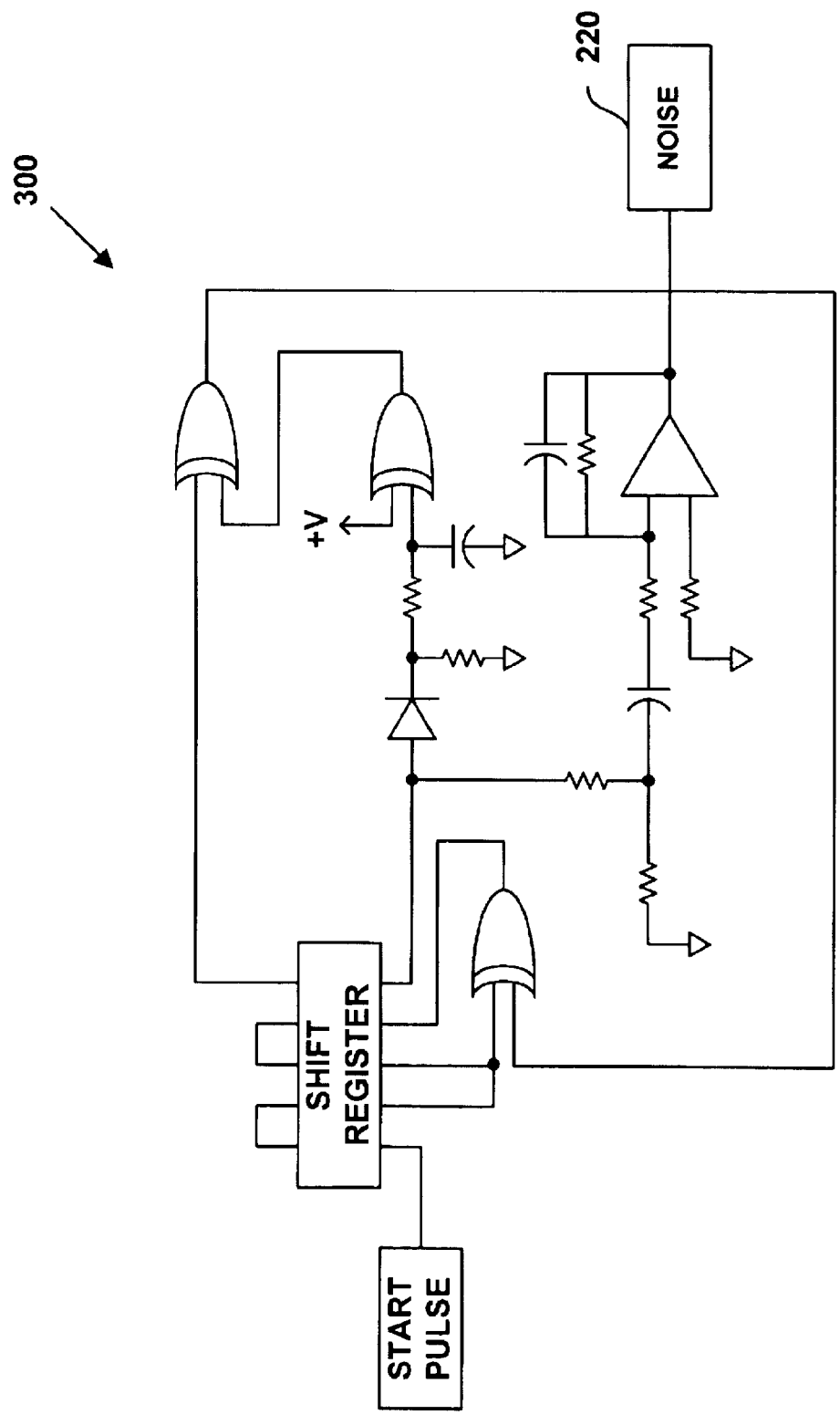
FIG. 3 is a schematic of a noise source, according to an exemplary embodiment.

FIG. 3 shows a schematic of a noise source 300. The noise source 300 may be used to provide the noise 220 in a preferred embodiment; however, noise source 300 is just one example of a circuit that may generate noise. Many different combinations of electronic circuitry may be capable of generating noise and may also be used in this embodiment. The noise source 300 may provide bandwidth limited white noise. Preferably, the tuning fork frequency of the at least one proof mass 202a, 202b may be located substantially within the bandwidth of the injected noise 220. For example, the bandwidth of the noise 200 may be centered substantially at the tuning fork frequency and may be substantially +/−1000 Hertz wide. By designing the noise source 300 to inject noise with bandwidth characteristics as described above, the drive electronics 218 may lock onto the tuning fork frequency quicker and may substantially reduce the number of times that the MEMS gyroscope system 200 fails to start.

In many applications it may be possible to use spare circuitry available in the drive electronics 218 to provide the noise source 300. While white noise may be preferred, Gaussian noise may also be capable of reducing the start time of a MEMS gyroscope. In addition, narrowband noise may also be injected to the drive electronics 218.

Injecting noise into the drive electronics 218 may substantially reduce the time it takes for the drive electronics 218 to lock onto the tuning fork frequency. For a typical MEMS gyroscope with a start time of one to two seconds, the start time may be reduced to one second or less. This start time may be beneficial for MEMS gyroscope applications that require the start time to be one second or less. For example, some inertial measurement units (IMUs) that include one or more MEMS gyroscopes may require a start time of one second or less.

It should be understood that the illustrated embodiments are exemplary only and should not be taken as limiting the scope of the present invention. While a MEMS tuning fork gyroscope is employed to illustrate the invention, the present invention also applies to other MEMS vibratory gyroscopes that use the Coriolis acceleration to detect rotation. The claims should not be read as limited to the described order or elements unless stated to that effect. Therefore, all embodiments that come within the scope and spirit of the following claims and equivalents thereto are claimed as the invention.

What is claimed is:

1. A method for improving a start time of a MEMS gyroscope system, comprising injecting bandwidth limited white noise into drive electronics connected to a MEMS gyroscope until the drive electronics locks onto a tuning fork frequency of at least one proof mass in the MEMS gyroscope.

2. The method of claim 1, wherein the MEMS gyroscope is a vibratory gyroscope.

3. The method of claim 1, wherein the MEMS gyroscope uses a Coriolis acceleration to detect rotation.

4. The method of claim 1, wherein the noise is injected into the drive electronics after applying a system power source to the MEMS gyroscope.

5. The method of claim 1, wherein the noise is injected into the drive electronics substantially before the MEMS gyroscope reaches full power.

6. The method of claim 1, wherein a bandwidth of the noise is substantially centered at the tuning fork frequency of the at least one proof mass.

7. The method of claim 1, wherein a bandwidth of the noise is substantially +/−1000 Hertz wide.

8. The method of claim 1, wherein the drive electronics applies a drive voltage to at least one motor drive comb which causes the at least one proof mass to oscillate.

9. A system for improving a start time of a MEMS gyroscope, comprising in combination:
a MEMS gyroscope;
drive electronics connected to the MEMS gyroscope; and
a noise source that injects bandwidth limited white noise into the drive electronics until the drive electronics locks onto a tuning fork frequency of at least one proof mass in the MEMS gyroscope.

10. The system of claim 9, wherein the MEMS gyroscope is a vibratory gyroscope.

11. The system of claim 9, wherein the MEMS gyroscope uses a Coriolis acceleration to detect rotation.

12. The system of claim 9, wherein the drive electronics applies a drive voltage to at least one motor drive comb which causes the at least one proof mass to oscillate.

13. The system of claim 9, wherein the noise is injected into the drive electronics after applying a system power source to the MEMS gyroscope.

14. The system of claim 9, wherein the noise is injected into the drive electronics substantially before the MEMS gyroscope reaches full power.

15. The system of claim 9, wherein the tuning fork frequency of the at least one proof mass is located substantially within a bandwidth of the noise.

16. The system of claim 15, wherein the bandwidth of the noise is substantially centered at the tuning fork frequency of the at least one proof mass.

17. The system of claim 15, wherein the bandwidth of the noise is substantially +/−1000 Hertz wide.

18. A system for improving a start time of a MEMS gyroscope, comprising in combination:
a vibratory gyroscope operable to use a Coriolis acceleration to detect rotation;
drive electronics operable to apply a drive voltage to at least one motor drive comb which causes at least one proof mass to oscillate, and wherein the drive electronics locks onto substantially a tuning fork frequency of the at least one proof mass; and
a noise source that injects bandwidth limited white noise into the drive electronics until the drive electronics locks onto the tuning fork frequency of the at least one proof mass, wherein a bandwidth of the noise is substantially centered at a tuning fork frequency of the at least one proof mass, and wherein the bandwidth of the noise is substantially +/−1000 Hertz wide.

19. The system of claim 18, wherein the noise is injected into the drive electronics after applying a system power source to the tuning fork gyroscope.

20. The system of claim 18, wherein the noise is injected into the drive electronics substantially before the tuning fork gyroscope reaches full power.

* * * * *